United States Patent
Auclair (12)

(10) Patent No.: US 6,329,592 B1
(45) Date of Patent: Dec. 11, 2001

(54) METER BOX GROUND CLAMP

(75) Inventor: Randolph L. Auclair, New Hartford, CT (US)

(73) Assignee: Electric Motion Company, Inc., Winsted, CT (US)

( * ) Notice: Subject to any disclaimer, the term of this patent is extended or adjusted under 35 U.S.C. 154(b) by 0 days.

(21) Appl. No.: 09/636,164

(22) Filed: Aug. 10, 2000

(51) Int. Cl.$^7$ ...................................................... H05K 5/02
(52) U.S. Cl. ........................... 174/51; 174/40 CC; 174/6; 174/135; 174/78; 439/92; 439/98; 361/799
(58) Field of Search ................................. 174/51, 59, 60, 174/6, 35 C, 135, 40 CC, 78; 439/98, 92, 100, 803; 361/799, 753; 220/3.7; 29/279

(56) References Cited

U.S. PATENT DOCUMENTS

| | | | |
|---|---|---|---|
| 5,160,271 | * | 11/1992 | Franks, Jr. ............................... 439/92 |
| 5,928,006 | * | 7/1999 | Franks, Jr. ............................... 439/92 |
| 6,118,071 | * | 9/2000 | Munch et al. ........................ 174/6 X |
| 6,188,020 | * | 2/2001 | Osterbrock et al. .................... 174/51 |

FOREIGN PATENT DOCUMENTS

2194860 * 3/1988 (GB) ...................................... 174/51

* cited by examiner

*Primary Examiner*—Dean A. Reichard
*Assistant Examiner*—Dhiru R Patel
(74) *Attorney, Agent, or Firm*—Alix, Yale & Ristas, LLP

(57) ABSTRACT

A ground clamp for connecting an edge portion of the metallic enclosure of an electrical meter box with a ground conductor. The ground clamp includes a U-shaped clamp member, a bolt member, and means for mounting the ground conductor. First and second legs of the clamp member define a slot and a pair of openings in the first leg form a center segment which separates a pair of fingers. The edge portion of the meter box enclosure is resiliently clamped within the slot between the fingers and the second leg. The center segment includes a socket having an inner surface, at least a portion of which has a thread. The bolt member has a stud portion and a bolt head portion, the stud portion including a threaded segment disposed proximate the distal end and an unthreaded shaft segment disposed intermediate the threaded segment and the bolt head portion. At least one protrusion extends axially from the distal end of the bolt member to a sharp edge. The stud portion is mounted in the socket of the clamp member such that the shaft segment is positioned in the threaded portion of the socket and the threaded segment is positioned within the slot when the sharp edge of the protrusion contacts the exterior surface of the edge portion received within the slot. The sharp edge of the protrusion removes the corrosion inhibiting coating from the exterior surface of the edge portion to electrically connect the meter box to the clamp without deforming the meter box enclosure upon rotation of the bolt member.

17 Claims, 6 Drawing Sheets

METER BOX GROUND CLAMP

BACKGROUND OF THE INVENTION

This invention relates generally to devices for implementing a ground connection between an electrical meter box and a common ground point. More particularly, the present invention relates generally to clamp devices which mount to an electrical meter box and connect via a flexible conductor with a common ground point.

A number of various types of devices have been employed for connecting a ground wire with an electrical meter box. Most conventional devices employ clamp assemblies of various forms. In applications to which the present invention relates, the connecting devices are ordinarily clamped onto the exterior of the electrical meter box which is mounted on the wall of a building.

A number of conventional designs are configured to mount rigidly or semi-rigidly onto the electrical meter box. For such designs, damage to the electrical meter box can occur when the clamping force is applied to the electrical meter box. For example, it is not uncommon for the electrical meter box to be bent or twisted when the clamping force is applied.

In another known design, the device clamps onto a corner of the electrical meter box. A lower flange of the device engages a bottom skirt of the electrical meter box top cover. A bolt theadably disposed through a top plate of the device engages the electrical meter box top cover. Applying a torque to the bolt causes the device to be clamped to the electrical meter box. Such devices may not provide an adequate electrical connection with the electrical meter box.

SUMMARY OF THE INVENTION

Briefly stated, the invention in a preferred form is a ground clamp for connecting the metallic enclosure of an electrical meter box with a ground conductor. The ground clamp comprises a U-shaped clamp member, a bolt member, and means for mounting the ground conductor. The clamp member has first and second legs which define a slot for receiving an edge portion of the meter box enclosure. The first leg has a pair of fingers which are separated from a center segment by a pair of openings. The edge portion of the meter box enclosure is resiliently clamped between the fingers and the second leg. The center segment includes a socket having an inner surface, at least a portion of which has a thread. The bolt member has a stud portion extending from the distal end and a bolt head portion extending from the proximal end. At least one protrusion extends axially from the distal end to a sharp edge. The stud portion includes a threaded segment disposed proximate the distal end and an unthreaded shaft segment disposed intermediate the threaded segment and the bolt head portion. The stud portion of the bolt member is mounted in the socket of the clamp member such that the shaft segment is positioned in the threaded portion of the socket and the threaded segment is positioned within the slot when the sharp edge of the protrusion contacts the exterior surface of the edge portion received within the slot. The sharp edge of the protrusion removes the corrosion inhibiting coating from the exterior surface of the edge portion to electrically connect the meter box to the clamp without deforming the meter box enclosure upon rotation of the bolt member.

The fingers and the second leg of the clamp member define a first gap and the center segment and the second leg of the clamp member define a second gap, where the width W3 of the second gap is greater than the width W1 of the first gap. The widths of the first and second gaps are selected such that W1 is less than the thickness T1 of the metal forming the edge portion of the meter box enclosure and W3 is greater than T1. Therefore, the edge portion of the meter box enclosure is clamped between the fingers and second leg and a gap (having a width W2) remains between the center segment and the exterior surface of the edge portion. Preferably, for an edge portion having the minimum thickness allowed by manufacturing tolerances ($T1_{min}$), $W2=W3-T1_{min}$.

The socket has a height H1, the thread of the socket has a length L1, and the threaded segment has a length L2, where $L2 \approx W2+(H1-L1)$. The socket may have an unthreaded portion disposed adjacent the slot. In this case, the unthreaded portion has a length L4, where $L4=H1-L1$.

The meter box ground clamp may also include a gel-filled boot which provides a water-tight seal with the exterior surface of the meter box enclosure to prevent corrosion of the edge portion of the meter box enclosure from which the corrosion inhibiting coating has been removed.

To establish a ground connection using the meter box ground clamp described above, the second leg of the clamp member within a seam of the meter box enclosure such that the edge portion of the meter box enclosure is received within the slot of the clamp member and is clamped between the fingers and second leg. A torque is applied to the bolt member until the sharp edge of the protrusion contacts the exterior surface of the edge portion. At this point any forces imposed by the bolt member on the meter box enclosure are resiliently absorbed by flexing the center segment or the second leg of the clamp member. Additional torque is applied to the bolt member until the sharp edge of the protrusion removes the corrosion inhibiting coating from the exterior surface of the edge portion. The ground wire is then mounted to the meter box ground clamp.

To seal the connection between the meter box ground clamp and the meter box enclosure, a gel-filled boot may be clamped between the ground wire and the surface of the edge portion of the meter box enclosure. The gel-filled boot is installed by inserting the bolt head portion of the bolt member through an opening in the gel-filled boot after the corrosion inhibiting coating has been removed from the exterior surface of the edge portion. Mounting the ground wire to the meter box ground clamp compresses the boot, biasing the boot into sealing engagement with the surface of the meter box enclosure.

An object of the invention is to provide a new and improved ground clamp for implementing a ground connection between an electrical meter box and a common ground point.

Another object of the invention is to provide a new and improved ground clamp for use with an electrical meter box that will not damage the box or the box finish.

A further object of the invention is to provide a new and improved ground clamp which is inexpensive to manufacture.

Other objects and advantages of the invention will become apparent from the drawings and specification.

BRIEF DESCRIPTION OF THE DRAWING

The present invention may be better understood and its numerous objects and advantages will become apparent to those skilled in the art by reference to the accompanying drawings in which.

DETAILED DESCRIPTION OF THE PREFERRED EMBODIMENT

Figure 1:
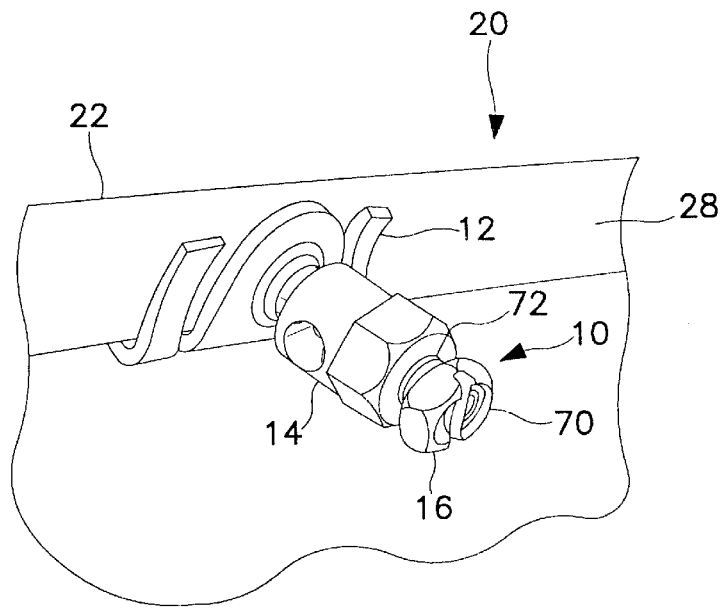
FIG. 1 is a perspective view of a meter box ground clamp in accordance with the invention which is installed on a meter box.
Figure 9A:
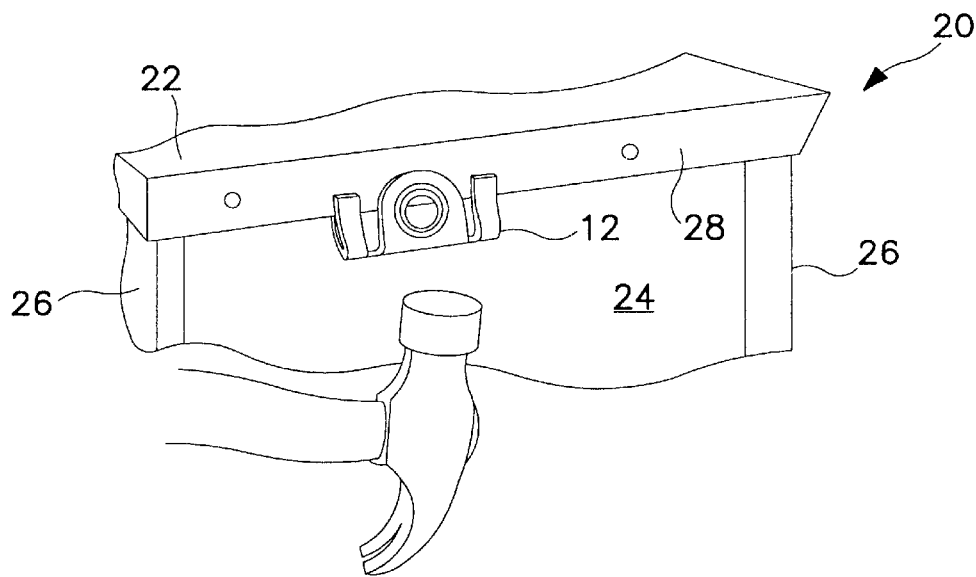
FIGS. 9a, 9b, and 9c illustrate the installation of a meter box ground clamp in accordance with the invention onto a meter box.

With reference to the drawings wherein like numerals represent like parts throughout the several figures, a meter box ground clamp in accordance with the present invention is generally designated by the numeral 10. As shown in FIG. 1, the ground clamp 10 comprises a clamp member 12, a bolt member 14, and a ground engagement bolt 16 which facilitate connecting a ground wire 18 to an enclosure 20 of an electrical meter box. The ground clamp 10 is especially useful for mounting a ground wire 18 to a conventional, rectangular meter box enclosure 20 having a drip cap 22, and front 24, rear (not shown), and side panels 26 (FIG. 9a). Typically, the drip cap 22 of such meter box enclosure 20 has a vertically extending lip portion 28 which overhangs and overlaps the top portions of the front, back and side panels. Although lip portion 28 provides a superior location for mounting the ground clamp 10, it may be mounted to any portion of the meter box enclosure 20.

Figure 2:
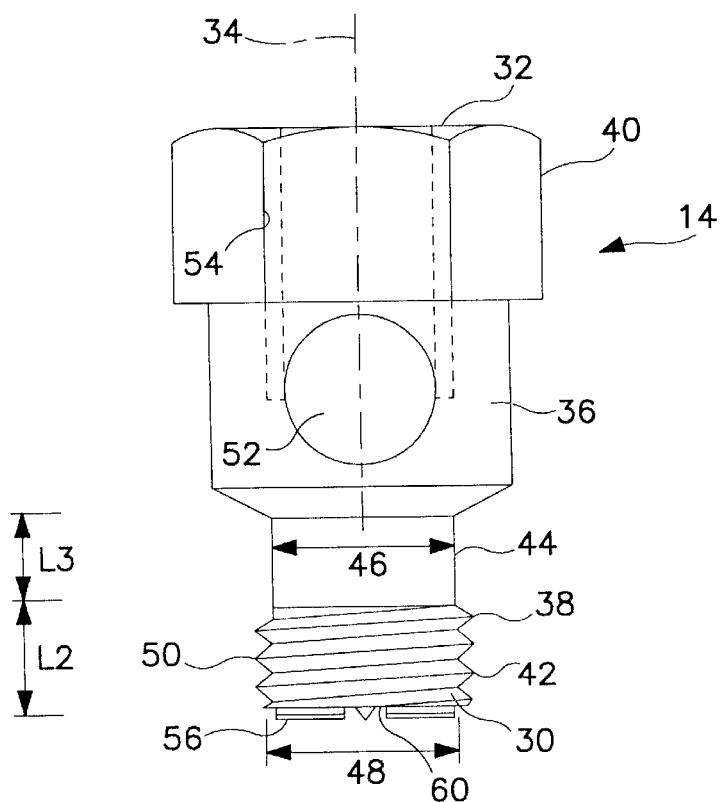
FIG. 2 is an enlarged side view of the bolt member of FIG. 1.
Figure 3:
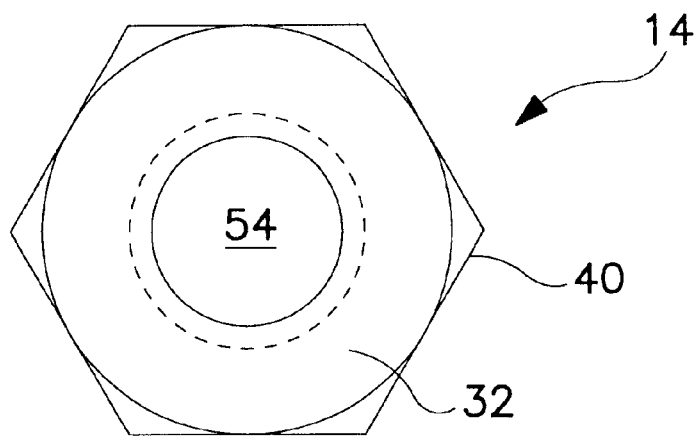
FIG. 3 is a top view of the bolt member of FIG. 2.
Figure 4:
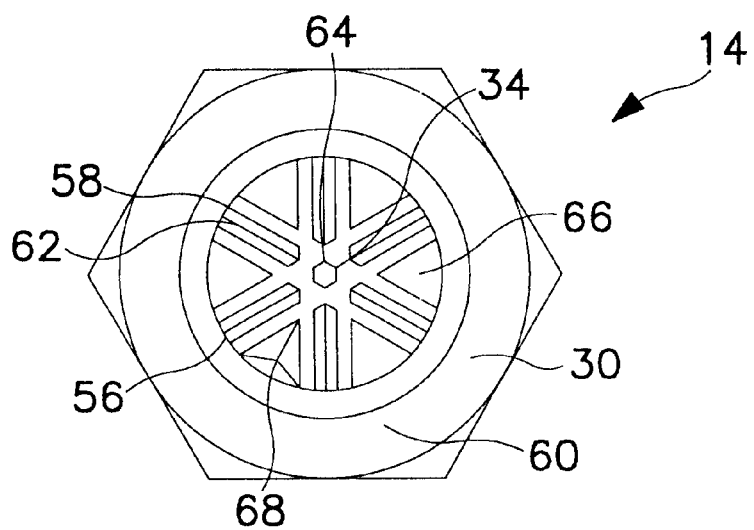
FIG. 4 is a bottom view of the bolt member of FIG. 2.

With reference to FIGS. 2, 3 and 4, the bolt member 14 is composed of silicon bronze, to provide corrosion resistance, high conductivity, and great strength, and has distal and proximal ends 30, 32 defining an axis 34. A ground connection portion 36 is disposed in the center of the bolt member 14, a stud portion 38 extends from the distal end 30 to the ground connection portion 36, and a bolt head portion 40 extends from the proximal end 32 to the ground connection portion 36. The stud portion 38 comprises a threaded segment 42 disposed proximate the distal end 30 of the bolt member 14 and a shaft segment 44 positioned intermediate the threaded segment 42 and the ground connection portion 36. The outside diameter 46 of the shaft segment 44 is equal to or less than the root diameter 48 of the thread 50 on the threaded segment 42.

The ground connection portion 36 defines a structural member having a transverse bore 52 which receives the ground wire 18. A threaded axial bore 54 longitudinally extending through the bolt head portion 40 and an upper portion of the ground connection portion 36 has an end which terminates in the transverse bore 52. The ground engagement bolt 16 is threadably positionable in the axial bore 54 wherein applying a torque to the ground engagement bolt 16 engages an end of the ground engagement bolt 16 with the ground wire 18 to clamp the ground wire in the transverse bore 52.

The distal end 30 of the bolt member 14 has a plurality of diggers 56 disposed thereon which remove the paint from a surface of the meter box enclosure 20 to provide an improved electrical connection. In the embodiment shown in FIG. 4, the diggers 56 comprise six radially extending, triangular-shaped bars 58 which extend axially from the surface 60 of the distal end 30 to a sharp, knife-like ridge 62. Protrusions 64, 66 having sharp tips suitable for removing paint from the meter box enclosure 20 may also extend axially outward from the center of surface 60 and from the portions of surface 60 which are disposed between bars 58. For example, the center protrusion 64 may be a six-sided, pyramid-shaped protrusion and the protrusions 66 between the bars 58 may be three-sided, pyramid-shaped protrusions. As described below, the ridges 62 of the bars 58 and the points 68 of the protrusions 64, 66 remove paint from the surface of the meter box enclosure 20 when the ground clamp 10 is installed to provide a metal-to-metal contact between the meter box enclosure 20 and the ground clamp 10.

With reference to FIG. 1, the ground engagement bolt 16 has a head segment 70 and a threaded shaft segment 72. The head segment 70 may have a slot, as shown in FIG. 1, a socket, or other device known in the art for receiving a driver such as the blade of a screw driver. The threaded shaft segment 72 is received within the axial bore 54 of the bolt member 14 and is threadably displaceable therein to clamp a ground wire 18 positioned in the transverse bore 52 of the bolt member 14. The ground engagement bolt 16 is composed of brass to provide corrosion resistance and super electrical conductivity.

Figure 5:
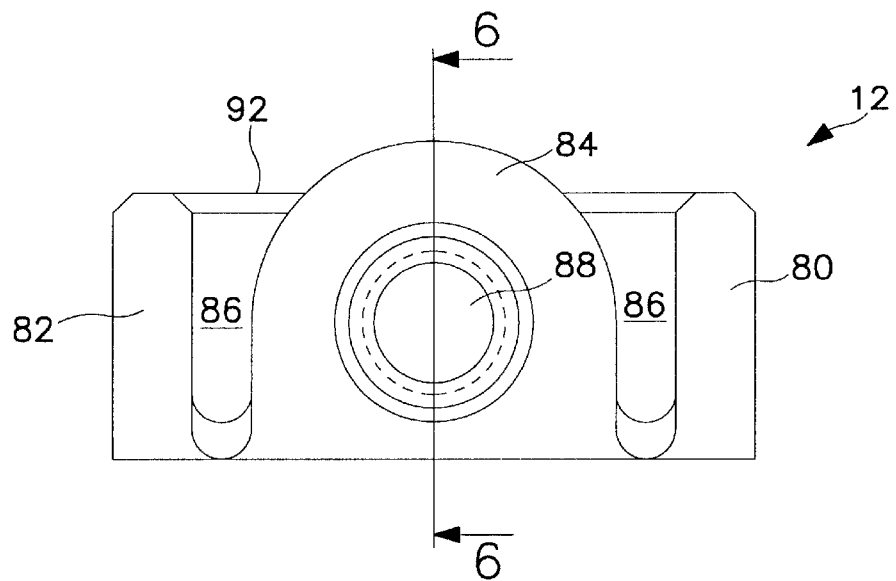
FIG. 5 is an enlarged top view of the clamp member of FIG. 1.
Figure 6:
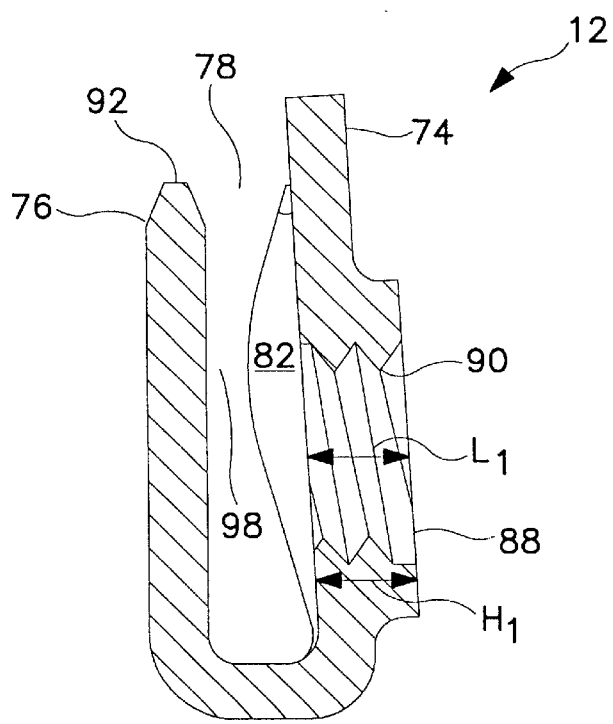
FIG. 6 is a cross-section view, of the clamp member of FIG. 5 taken along line 6—6.
Figure 7:
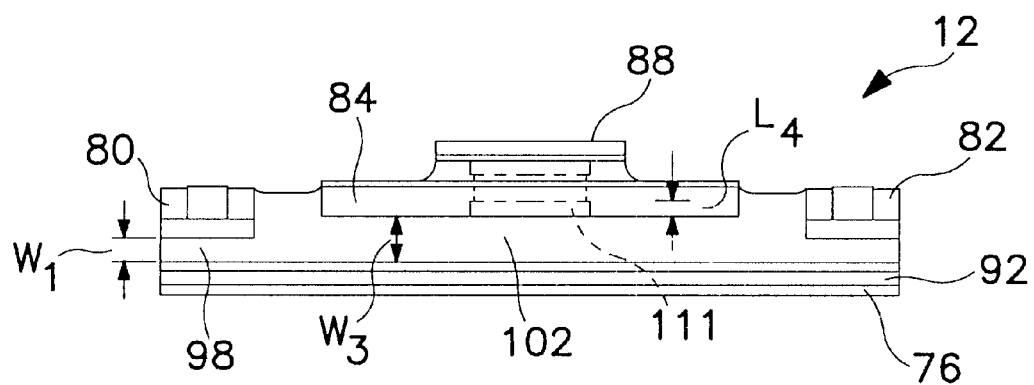
FIG. 7 is a front view of the clamp member of FIG. 5.
Figure 8:
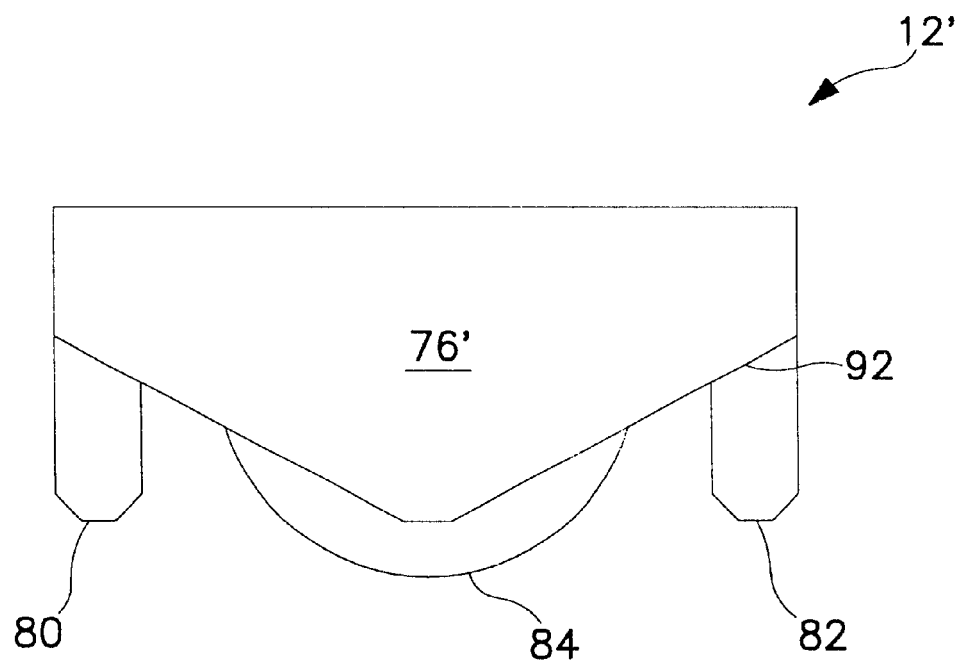
FIG. 8 is a bottom view of an alternate embodiment of the clamp member of FIG. 5.

With reference to FIGS. 5, 6 and 7, the clamp member 12 is U-shaped, having first and second legs 74, 76 which form a slot 78 therebetween. The first leg 74 of the clamp member 12 includes resilient right and left fingers 80, 82 which are separated from an intermediate center segment 84 by a pair of openings 86. A socket 88 in the center segment 84, which is internally threaded 90, receives threaded segment 42 of the bolt member 14. The leading edge 92 of the second leg 76 has a reduced thickness which facilitates insertion of the second leg 76 between the lip portion 28 of the drip cap 22 and the front panel 24 of the meter box enclosure 20. This reduced thickness may be provided by forming the leading edge 92 into a knife-edge, as shown in FIG. 6. In an alternate embodiment, the second leg 76' may have a wedge-shape, as shown in FIG. 8, to further facilitate insertion of the second leg 76'. The clamp member 12 is composed of stainless steel to provide corrosion resistance and superior resiliency.

Figure 10:
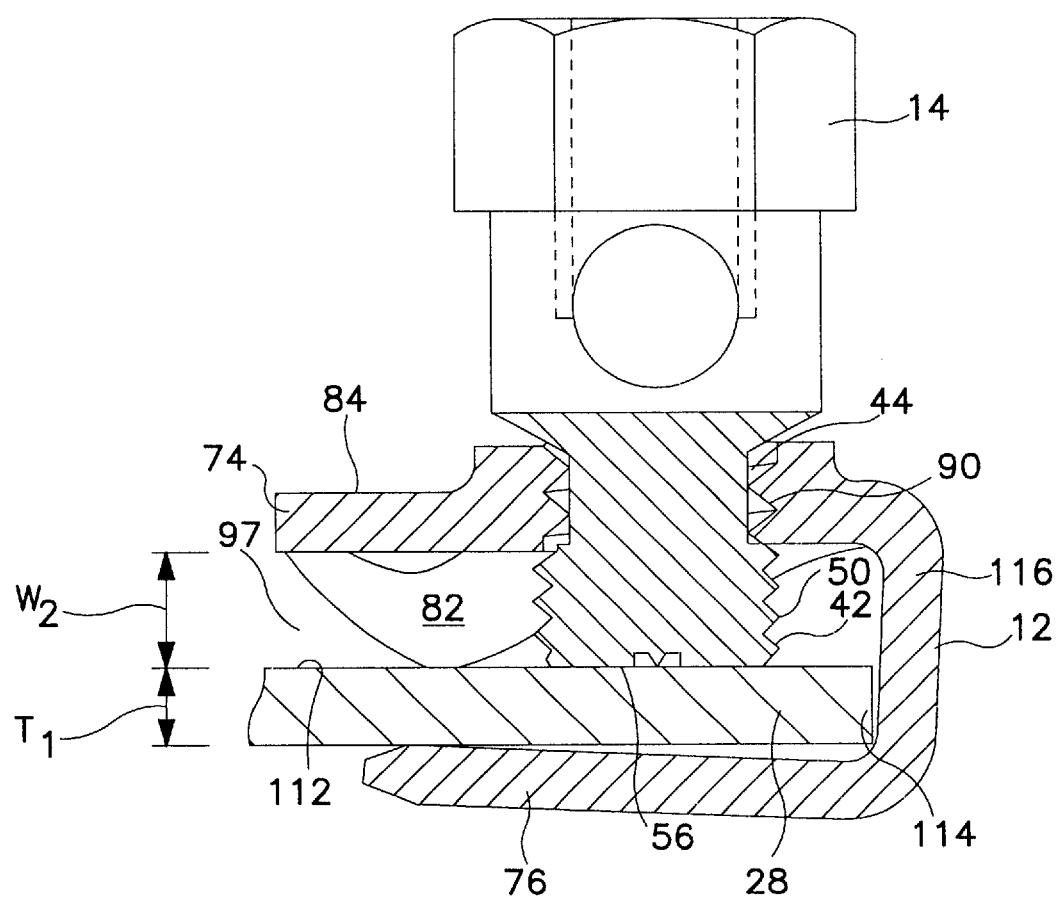
FIG. 10 is an enlarged side view, partly in cross-section, of the meter box ground clamp and meter box of FIG. 9b.

As described below, the lip portion 28 of the meter box enclosure 20 is inserted into slot 78 to mount the clamp member 12 on the enclosure 20. The sheet metal from which the meter box enclosure 20 is typically manufactured generally has a thickness T1 (FIG. 10) of 0.050 inches with a manufacturing tolerance of +0.002 inches and −0.002 inches. Sheet metal of this thickness is generally used because the Underwriter's Laboratory will not approve a meter box enclosure 20 having a smaller thickness and utilizing sheet metal having a larger thickness would put a manufacturer at a competitive disadvantage. The right and left fingers 80, 82 extend into the slot 78 such that the width W1 of the gap 98 between the fingers 80, 82 and the second leg 76 is less than the thickness T1 of lip portion 28, whereby lip portion 28 is biasedly clamped between the second leg 76 and the right and left fingers 80, 82 of the first leg 74. Preferably, there is a gap 97, having width W2, between the surface 112 of the lip portion 28 and the center segment 84 when the lip portion 28 is clamped between the fingers 80, 82 and the second leg 76. In a preferred embodiment, gap 98 has a width W1 of 0.050 inches. The width W3 of the gap 102 between the center segment 84 and the second leg 76 is greater than width W1 and thickness T1.

In a preferred embodiment, the height H1 of socket 88, the length L1 of the thread 90 of socket 88, the length L2 of the thread of threaded segment 42, the length L3 of shaft segment 44, and the width W3 of gap 102 are all selected such that the distal end 30 of the bolt member 14 will just come into contact with the surface 112 of lip portion 28 when the thread 90 of socket 88 is disposed opposite the non-threaded shaft segment 44, as described below, when the thickness T1 of lip portion 28 is at the minimum allowed by manufacturing tolerances ($T1_{min}$). It should be appreciated that socket 88 may have an unthreaded portion 111, having a length L4, disposed adjacent slot 78 (FIG. 7). In other words, L2 is substantially equal to W2+(H1−L1), where W2=W3−$T1_{min}$.

If lip portion 28 has a thickness T1 greater than $T1_{min}$, the distal end 30 of the bolt member will contact the surface 112 of the lip portion 28 while threads 90 and 50 are still engaged. Applying additional torque to the bolt member 14 will cause center segment 84 and/or second leg 76 to be resiliently flexed until thread 90 passes beyond thread 50 and is disposed opposite the non-threaded shaft segment 44. Consequently, the flexure of the center segment 84 and/or the second leg 76 absorbs any force which might have resulted in deformation of the meter box enclosure 20. For example, in an embodiment having a bolt member 14 with a 5/16–24 thread 50 on the threaded segment 42, the length L2 of thread 50 is 0.160 inches, the shaft segment 44 is 0.125 inches long, and width W3 is 0.085 inches. The height H1 of the socket 88 is 0.113 inches and the 5/16–24 thread 90 in the opening in the socket 88 runs the full height of the socket 88 for a total length L1 of 0.113 inches.

It should be appreciated that the length L4 of the unthreaded portion 111 of socket 88 may be selected such that threaded segment 42 enters the unthreaded portion 111 of the socket 88 to limit the flexure of the center segment 84 and/or the second leg 76. This is reflected in the formula above, where L4=H1−L1.

Alternatively, the height H1 of socket 88, the length L1 of the thread 90 of socket 88, the length L2 of the thread 50 of threaded segment 42, the length L3 of shaft segment 44, and the width W3 of gap 102 may be selected such that the distal end 30 of the bolt member 14 will just come into contact with the surface 112 of lip portion 28 when the thread 90 of socket 88 is disposed opposite the non-threaded shaft segment 44 when the thickness T1 of lip portion 28 is at either the nominal thickness allowed by manufacturing tolerances ($T1_{nom}$) or the maximum thickness allowed by manufacturing ($T1_{max}$).

Figure 9B:
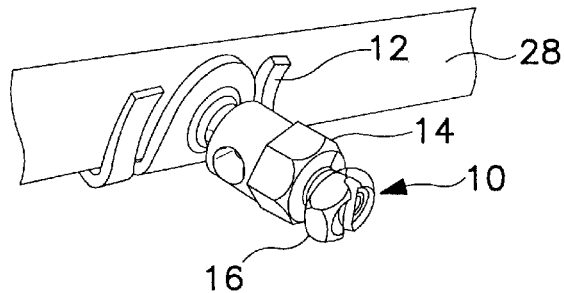
Figure 9C:
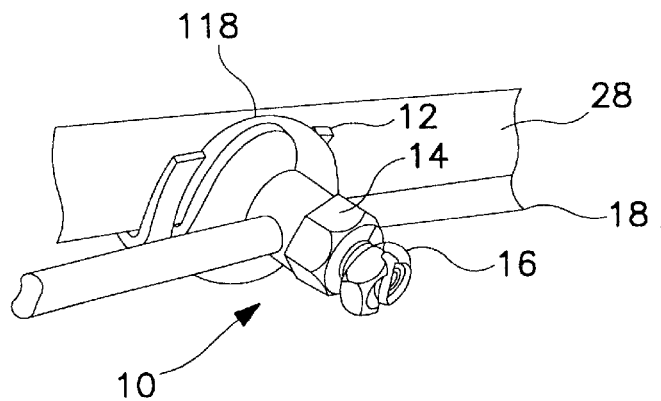

With reference to FIGS. 9a–9c, the ground clamp 10 is preferably installed by inserting the leading edge 92 of the second leg 76 of the clamp member 12 into the seam between lip portion 28 and the front panel 24 of the meter box enclosure 20. The clamp member 12 is then driven into place, by a hammer or other suitable tool, such that the edge 114 of the lip portion 28 is disposed adjacent the base 116 of the clamp member 12. As the clamp member 12 is driven into place, the left and right fingers 82, 80 are forced away from second leg 76 to allow passage of lip portion 28. The resilient force of the right and left fingers 80, 82 clamps the lip portion 28 of the meter box drip cap 22 within slot 78 and biases the lip portion 28 toward the second leg 76 of the clamp member 12. The clamp member 12 may also be mounted to a side panel 26, the back panel, or the front panel 24, although the location on the drip cap 22 minimizes the probability that the ground clamp 10 may be accidentally hit and knocked-off.

The threaded segment 42 of the bolt member 14 is threadably engaged within socket 88 and torqued until the thread 90 of the socket 88 passes beyond the thread 50 of threaded segment 42 and is disposed opposite the non-threaded shaft segment 44. At this point the bolt member 14 will turn freely with the distal end 30 of the bolt member 14 contacting the surface 112 of lip portion 28 which is urged toward the bolt member 14 by the second leg 76 of the clamp member 12. The bolt member 14 is then rotated at least four (4) full turns, each full rotation of the bolt member 14 producing a clicking noise as the end of thread 50 passes over the end of thread 90, As the distal end 30 of the bolt member 14 rotates, the diggers 56 remove any paint, corrosion, or any other coating on that portion of the surface 112 of lip portion 28 which is contacted by the bolt member 14. The resilient force of the right and left fingers 80, 82 provide a continuous clamping force to ensure that clamp member 12 remains in a stationary position as the bolt member 14 removes the paint from the meter box enclosure 20. A ground wire 18 is inserted into transverse bore 52 and the ground engagement bolt 16 is torqued to clamp the ground wire 18 therein.

As shown in FIG. 9c, a gel-filled boot 118 may be inserted over the bolt member 14 before the ground wire 18 is installed. Insertion of the ground wire 18 into the transverse bore 52 compresses the boot 118, biasing the boot 118 toward the clamp member 12 and causing the boot 118 to provide a weather-tight seal which prevents the meter box enclosure 20 from corroding in the area from which the paint has been removed.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A meter box ground clamp for clamping a ground wire to a meter box, the meter box including a metallic enclosure having a corrosion inhibiting coating on at least its exterior surface and at least one edge portion forming an overlapping seam, the meter box ground clamp comprising:

a U-shaped clamp member having first and second legs defining a slot, the first leg including a pair of resilient fingers which are separated from a center segment by a pair of openings, the center segment including a socket having an inner surface, at least a portion of the inner surface having a thread;

a bolt member having distal and proximal ends, a stud portion extending from the distal end and a bolt head portion extending from the proximal end, the distal end having at least one protrusion extending axially therefrom to a sharp edge, the stud portion having a threaded segment disposed proximate the distal end and an unthreaded shaft segment disposed intermediate the threaded segment and the bolt head portion, the threaded segment being threadably mountable in the socket of the clamp member; and means adapted for clamping the ground wire;

wherein the clamp member is adapted for receiving an edge portion of the meter box enclosure within the slot and resiliently clamping the edge portion between the fingers and second leg and the bolt member is adapted for positioning the shaft segment in the threaded socket and the threaded segment within the slot when the sharp edge of the protrusion contacts the exterior surface of the edge portion received within the slot, the sharp edge of the protrusion removing the corrosion inhibiting coating from the exterior surface of the edge portion to electrically connect the meter box to the clamp without deforming the meter box enclosure upon rotation of the bolt member.

2. The meter box ground clamp of claim 1 wherein the second leg of the clamp member has a thickness and a leading edge, the leading edge having a thickness which is less than the thickness of the second leg.

3. The meter box ground clamp of claim 2 wherein the leading edge is a knife-edge.

4. The meter box ground clamp of claim 2 wherein the leading edge has a wedge-shape.

5. The meter box ground clamp of claim 1 wherein the fingers of the first leg of the clamp member and the second leg of the clamp member define a first gap and the center segment of the first leg of the clamp member and the second leg of the clamp member define a second gap, the first and second gaps each having a width, the width of the second gap being greater than the width of the first gap.

6. The meter box ground clamp of claim 1 wherein the clamp member is adapted to define a gap, having a width W2, between the center segment of the first leg and the exterior surface of an edge portion received in the slot.

7. The meter box ground clamp of claim 6 wherein the socket has a height H1, the thread of the socket has a length L1, and the threaded segment has a length L2, where L2 is substantially equal to W2+(H1−L1).

8. The meter box ground clamp of claim 1 further comprising a gel-filled boot adapted for providing a watertight seal with the exterior surface of the meter box enclosure.

9. A meter box grounding system comprising:
a metallic meter box enclosure including at least one edge portion, an exterior surface, and a corrosion inhibiting coating on at least the exterior surface, the edge portion having a thickness T1;
a ground wire; and
a meter box ground clamp including
means for clamping the ground wire;
a U-shaped clamp member having first and second legs defining a slot, the edge portion of the meter box enclosure being disposed in the slot, the first leg including a pair of resilient fingers which are separated from a center segment by a pair of openings, each of the fingers and the second leg defining a gap having a width W1, T1 being greater than W1, whereby the fingers clamp the edge portion of the meter box enclosure in the slot, the center segment including a socket having an inner surface, at least a portion of the inner surface having a thread; and
a bolt member having distal and proximal ends, a stud portion extending from the distal end and a bolt head portion extending from the proximal end, the distal end having at least one protrusion extending axially therefrom to a sharp edge, the stud portion having a threaded segment disposed proximate the distal end and an unthreaded shaft segment disposed intermediate the threaded segment and the bolt head portion, the shaft segment positionable in the portion of the socket having the thread whereby at least a portion of the threaded segment is positioned within the slot, and the sharp edge of the protrusion contacts the exterior surface of the edge portion disposed within the slot;
wherein, the sharp edge of the protrusion removes the corrosion inhibiting coating from the exterior surface of the edge portion to electrically connect the meter box to the clamp without deforming the meter box enclosure upon rotation of the bolt member.

10. The meter box grounding system of claim 9 wherein the center segment of the first leg and the exterior surface of the edge portion disposed in the slot define a second gap, having a width W2, wherein W2>T1.

11. The meter box grounding system of claim 10 wherein the socket has a height H1, the thread of the socket has a length L1, and the threaded segment has a length L2, where L2 is substantially equal to W2+(H1−L1).

12. The meter box grounding system of claim 10 wherein the center segment of the first leg and the second leg define a third gap having a width W3 and the thickness T1 of the edge portion has a minimum value allowed by manufacturing tolerances $T1_{min}$, wherein $W2=W3-T1_{min}$.

13. The meter box grounding system of claim 10 wherein the socket has an unthreaded portion disposed adjacent the slot, the unthreaded portion having a length L4, wherein L4=H1−L1.

14. A method of grounding a metallic meter box enclosure with a meter box ground clamp, the meter box enclosure having a corrosion inhibiting coating on at least its exterior surface and at least one edge portion forming an overlapping seam, the meter box ground clamp including a U-shaped clamp member, a bolt member, and means for clamping the ground wire, the clamp member having first and second legs defining a slot, the first leg including a pair of resilient fingers which are separated from a center segment by a pair of openings, the center segment including a socket having an inner surface, at least a portion of the inner surface having a thread, the bolt member having distal and proximal ends, a stud portion extending from the distal end and a bolt head portion extending from the proximal end, the distal end having at least one protrusion extending axially therefrom to a sharp edge, the stud portion having a threaded segment disposed proximate the distal end and an unthreaded shaft segment disposed intermediate the threaded segment and the bolt head portion, the threaded segment being threadably mounted in the socket of the clamp member, the method comprising the steps of:
inserting the second leg of the clamp member within the seam, the edge portion of the meter box enclosure being received within the slot of the clamp member and being clamped between the fingers and the second leg;
a) applying torque to the bolt member until the sharp edge of the protrusion contacts the exterior surface of the edge portion;
b) resiliently absorbing force imposed on the meter box enclosure by flexing the center segment or the second leg; and
c) applying additional torque to the bolt member until the sharp edge of the protrusion removes the corrosion inhibiting coating from the exterior surface of the edge portion.

15. The method of claim 14 further comprising the step of d) mounting a ground wire to the meter box ground clamp.

16. The method of claim 15 wherein the meter box ground clamp further includes a gel-filled boot having an opening and step c) further comprises inserting the bolt head portion of the bolt member through the opening in the gel-filled boot after the corrosion inhibiting coating has been removed from the exterior surface of the edge portion.

17. The method of claim 16 wherein step d) further includes biasing the gel-filled boot into sealing contact with the meter box enclosure with the ground wire.

* * * * *

UNITED STATES PATENT AND TRADEMARK OFFICE
CERTIFICATE OF CORRECTION

PATENT NO. : 6,329,592 B1
DATED : December 11, 2001
INVENTOR(S) : Auclair

It is certified that error appears in the above-identified patent and that said Letters Patent is hereby corrected as shown below:

<u>Column 7,</u>
Line 45, after "defining a" insert -- first --.

Signed and Sealed this

Twenty-fourth Day of September, 2002

Attest:

Attesting Officer

JAMES E. ROGAN
*Director of the United States Patent and Trademark Office*